(12) United States Patent
Komoto et al.

(10) Patent No.: US 6,677,614 B1
(45) Date of Patent: *Jan. 13, 2004

(54) SEMICONDUCTOR LIGHT-EMITTING DEVICE AND METHOD FOR MANUFACTURING THE DEVICE

(75) Inventors: Satoshi Komoto, Tokyo (JP); Toshiaki Tanaka, Kitakyusyu (JP); Norio Fujimura, Kitakyushyu (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/019,158

(22) Filed: Feb. 5, 1998

Related U.S. Application Data

(62) Division of application No. 08/720,819, filed on Oct. 2, 1996, now Pat. No. 5,763,901, which is a continuation of application No. 08/495,832, filed on Jun. 28, 1995, now abandoned, which is a continuation of application No. 08/066,035, filed on May 16, 1994, now Pat. No. 5,581,372.

(30) Foreign Application Priority Data

Dec. 17, 1992 (JP) ............................................ P4-336901

(51) Int. Cl.[7] .............................................. H01L 31/12
(52) U.S. Cl. ......................... 257/81; 257/89; 257/100; 257/432; 257/433; 257/676; 257/788
(58) Field of Search ........................... 257/98, 99, 100, 257/88, 89, 81, 676, 787, 788, 431–434, 734; 438/26, 27; 362/800

(56) References Cited

U.S. PATENT DOCUMENTS

| | | | |
|---|---|---|---|
| 3,609,475 A | * | 9/1971 | Kaposhilin |
| 3,694,902 A | * | 10/1972 | Apgar et al. |
| 3,764,862 A |   | 10/1973 | Jankowski |
| 5,763,901 A | * | 6/1998 | Komoto et al. |

FOREIGN PATENT DOCUMENTS

| | | | |
|---|---|---|---|
| JP | 50-146362 | * | 6/1977 |
| JP | 58-70079 | * | 5/1980 |
| JP | 5 105 390 | | 8/1980 |
| JP | 55-105390 | | 8/1980 |
| JP | 57-68088 | * | 4/1982 |
| JP | 5 856 483 | | 4/1983 |
| JP | 5 866 373 | | 4/1983 |
| JP | 58-68992 | * | 4/1983 |
| JP | 6 098 688 | | 6/1985 |
| JP | 6 276 577 | | 4/1987 |
| JP | 63-129680 | * | 6/1988 |
| JP | 1-32688 | * | 2/1989 |
| JP | 1-266771 | * | 10/1989 |
| JP | 2-29686 | * | 1/1990 |
| JP | 2-52463 | | 4/1990 |
| JP | 3 171 681 | | 7/1991 |
| JP | 3-171681 | | 7/1991 |
| JP | 5-327029 | * | 12/1993 |
| JP | 61-112534 | * | 4/1994 |

* cited by examiner

*Primary Examiner*—Alonzo Chambliss
(74) *Attorney, Agent, or Firm*—Finnegan, Henderson, Farabow, Garrett & Dunner, L.L.P.

(57) ABSTRACT

A semiconductor light-emitting device has a pair of leads placed in parallel, a light-emitting element on the upper end of one lead, a bonding wire for electrically connecting the semiconductor light-emitting element of the upper end of another lead, and an envelope formed from a light-transmitting resin for sealing the semiconductor light-emitting element, the bonding wire, and the upper end of the leads, provided with a non-circular lateral cross-sectional surface structure with a long axis and a short axis. In the device, when observed along a direction in which the plurality of light-emitting devices are mounted on a same lead frame, a curvature of the lateral direction of said envelope is smaller than a curvature of the vertical direction of said envelope.

4 Claims, 13 Drawing Sheets

LEAD FRAME 8

LEAD FRAME LINE

LEAD FRAME 8

SEMICONDUCTOR LIGHT-EMITTING DEVICE AND METHOD FOR MANUFACTURING THE DEVICE

This is a divisional of application Ser. No. 08/720,819, filed Oct. 2, 1996, now U.S. Pat. No. 5,763,901; which is a continuation of application Ser. No. 08/495,832 filed Jun. 28,1995, now abandoned; which is a continuation of application Ser. No. 08/066,035, filed May 16,1994, now U.S. Pat. No. 5,581,372, all of which are incorporated herein by reference.

BACKGROUND OF THE INVENTION

1. Field of the Invention

The present invention relates to a semiconductor light-emitting device and to a method for manufacturing such a device, and, in particular, to the shape of an envelope for enclosing the semiconductor light-emitting device.

2. Description of the Prior Art

A manufacturing process for a conventional semiconductor light-emitting device will now be explained.

FIG. 1, FIGS. 2A and 2B, FIGS. 3A and 3B, and FIGS. 4A, 4B are diagrams illustrating this manufacturing process.

FIG. 1 is a diagram showing a plurality of semiconductor light-emitting elements mounted on and bonded to a lead frame.

FIG. 2A is a view of the upper surface of an envelope adjusting jig.

FIG. 2B is a longitudinal cross-section viewed along the line II B–II B' in FIG. 2A.

FIG. 3A is an upper surface view showing conditions after shape of the envelopes. FIG. 3B is a longitudinal cross-section viewed along the line III B–III B' in FIG. 3A.

FIG. 4A is a view of the upper surface of a completed conventional semiconductor light-emitting device. FIG. 4B is a longitudinal cross-section viewed along the line IV B–IV B' in FIG. 4A.

In FIG. 1, the reference numeral 8 designates a lead frame. A lead group made up of a pair of leads 9, 9' is formed at a uniform spacing in the longitudinal direction of the lead frame 8. For example, the uniform spacing between adjacent lead groups is approximately 6 to 7 mm and the leads 9, 9' are made up of Fe wires.

In FIG. 2A, the reference numeral 12 designates an envelope adjusting jig. A plurality of cavities 13 with circular lateral cross-sections and almost U-shaped longitudinal cross-sections is positionally arranged in a straight line at the same spacing as the lead groups on the lead frame.

First of all, as shown in FIG. 1, a semiconductor light-emitting element 10 is mounted on the upper end of one of the leads 9 in each of the lead groups on the lead frame 8. The upper surface of the semiconductor light-emitting element 10 and the other lead 9' are electrically connected by a bonding wire 11.

Next, a light-transmitting resin such as a liquid mixture of epoxy resin, the leis filled into the cavities 13 of the envelope adjusting jig 12 shown in FIGS. 2A and 2B, then the lead groups of the lead frame 8 are inserted into the respective cavities 13 and the light-transmitting resin is thermally cured.

As shown in FIGS. 3A and 3B, the mounted section of the semiconductor light-emitting element 10 of the lead groups and the upper end section of the bonding wire 11 and the leads 9, 9' are sealed in an envelope 14 formed by the light-transmitting resin. Subsequently, as shown in FIGS. 4A and 4B, each of the lead groups is separated from the lead frame 8 at the part shown by the broken lines in FIG. 3B with a cutter to complete the semiconductor light-emitting device.

Recently, there have been demands for semiconductor light-emitting devices with a high output. Also, it is commonly known that the diameter 14D of the light-emitting device 14 should be made as large as possible to successfully obtain high output.

However, for good production efficiency in this manufacturing method for the conventional semiconductor light-emitting device, the spacing between the lead groups is set so that it is possible to form about 10 to 30 semiconductor light-emitting devices using one lead frame, and, in addition, the diameter 13D of the envelope depends on the spacing of the lead groups on the lead frame. For this reason, there is the problem that even when it is desired to increase the diameter of the envelope to obtain high output, this diameter is limited by the spacing of the lead groups. In addition, when the spacing of the lead groups is increased to provide an envelope with a large diameter, the number of semiconductor light-emitting devices obtained from one lead frame is reduced. This results in the problem of poor production efficiency.

SUMMARY OF THE INVENTION

Accordingly, an object of the present invention is, with due consideration to the drawbacks of such conventional devices, to provide a semiconductor light-emitting device from which high output can be obtained by increasing the spacing between the lead groups on a lead frame, and to provide a method for manufacturing such a semiconductor light-emitting device.

The present invention provides a semiconductor light-emitting device, as one of preferred embodiments, formed on a same lead frame on which a plurality of semiconductor light-emitting devices are formed in a straight line at a uniform spacing, said each semiconductor light-emitting device comprising:

a plurality of lead means placed in parallel;

semiconductor light-emitting means mounted on the upper end of one of said leads;

bonding wire means for electrically connecting the semiconductor light-emitting means and the upper end of another lead means with a long axis and a short axis; and envelope means formed from a light-transmitting resin for sealing said semiconductor light-emitting means, said bonding wire, and the upper end of said lead, provided with a non-circular lateral cross-sectional surface structure, wherein when observed along a direction in which the plurality of light-emitting devices are mounted on the same lead frame, a curvature of the lateral direction of said envelope is smaller than a curvature of the vertical direction of said envelope.

In the semiconductor light-emitting device above, for the lateral cross-section of said envelope is shaped by being cut one part of said envelop in a straight line along the direction in which the plurality of light-emitting devices are mounted on the same lead frame.

In addition, the lateral cross-sectional shape of said envelop means is an ellipse shape in the semiconductor light-emitting device described above as a preferred embodiment.

Moreover, the number of said lead means is two, and the number of said semiconductor light-emitting means is one in the semiconductor light-emitting device described above as a preferred embodiment.

Furthermore, the number of said lead means is three, and the number of said semiconductor light-emitting means is two in the semiconductor light-emitting device described above as a preferred embodiment.

The present invention also provides a manufacturing process for a semiconductor light-emitting device, as another preferred embodiment, formed on a plurality of lead frames, on each of the lead frames a plurality of semiconductor light-emitting devices are formed, comprising steps of:

- a process for forming the lead frame with a plurality of groups of side-by-side leads positioned in a straight line at a uniform spacing;
- a process for forming an envelope adjusting jig whereon cavities at a plurality of points are positioned on the non-circular lateral cross-sectional surface structure, with a long axis and a short axis, so that when observed along a direction in which the plurality of light-emitting devices are formed on the same lead frame, a curvature of the lateral direction of said each envelope in the same lead frame is smaller than a curvature of the vertical direction of said each envelope, and the short axis is positioned on a straight line at a spacing which is the same spacing as the group of leads;
- a process for mounting the semiconductor light-emitting element on the upper end of one lead of the group of leads and for connecting the semiconductor light-emitting element and the upper ends of the other leads of the group of leads with bonding wires;
- a process for filling the light-transmitting resin into the cavities of the envelope adjusting Jig;
- a process for immersing the semiconductor light-emitting element, the bonding wire, and the upper end of the leads in the light-transmitting resin in the cavities and sealing this part with the light-transmitting resin; and
- a process for removing the lead frame from the envelope adjusting jig and separating each group of leads from the lead frame.

In the manufacturing process for a semiconductor light-emitting device described above, further comprising a process for offsetting the lead frames alternately at a suitable length only, so that the lead frames are respectively parallel.

BRIEF DESCRIPTION OF THE DRAWINGS

These and other objects, features, and advantages of the present invention will become more apparent from the following description of the preferred embodiments taken in conjunction with the accompanying drawings, in which:

FIG. 2A is a view of the upper surface of the adjusting jig. FIG. 2B is a longitudinal cross section viewed along the line II B–II B' in FIG. 2A.

FIG. 3A is a view of the upper surface of the adjusting jig. FIG. 3B is a longitudinal cross section viewed along the line III B–III B' in FIG. 2A.

FIG. 4A is a view of the upper surface of the conventional semiconductor light-emitting device. FIG. 4B is a cross sectional view of the conventional semiconductor light-emitting device shown in FIG. 4A along the line IV B–IV B' in FIG. 4A.

FIG. 8A is a view of the upper surface of the semiconductor light-emitting device. FIG. 8B is a longitudinal cross section viewed along the line VIII B–VIII B' in FIG. 8A.

FIG. 9A is a view of the upper surface of the semiconductor light-emitting device of the present invention. FIG. 9B is a cross sectional view of the semiconductor light-emitting device shown in FIG. 9A.

FIG. 10A is a view of the upper surface of the semiconductor light-emitting device of the second embodiment of the present invention. FIG. 10B is a cross sectional view of the semiconductor light-emitting device shown in FIG. 10A along the line X B–X B' in FIG. 10A.

FIG. 11A is a view of the upper surface of the semiconductor light-emitting device of the third embodiment of the present invention. FIG. 10B is a cross sectional view of the semiconductor light-emitting device shown in FIG. 11A along the line X I B–X I B' in FIG. 11A.

FIG. 13A is a view of the upper surface of the semiconductor light-emitting device of the fourth embodiment of the present invention. FIG. 13B is a cross sectional view of the semiconductor light-emitting device shown in FIG. 13A along the line X III B–X III B' in FIG. 13A.

DETAILED DESCRIPTION OF THE PREFERRED EMBODIMENTS

Other features of this invention will become apparent in the course of the following description of exemplary embodiments which are given for illustration of the invention and are not intended to be limiting thereof.

First of all, we will describe the features of the present invention for clearly understanding.

Figure 8A:
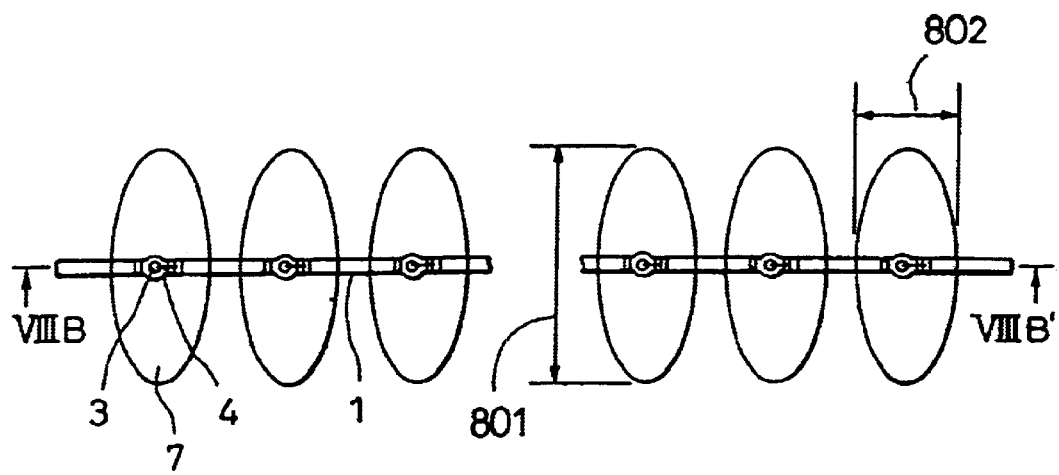
FIGS. 8A and 8B are diagrams showing the conditions after shape of the envelopes in the first embodiment of the present invention.
Figure 8B:
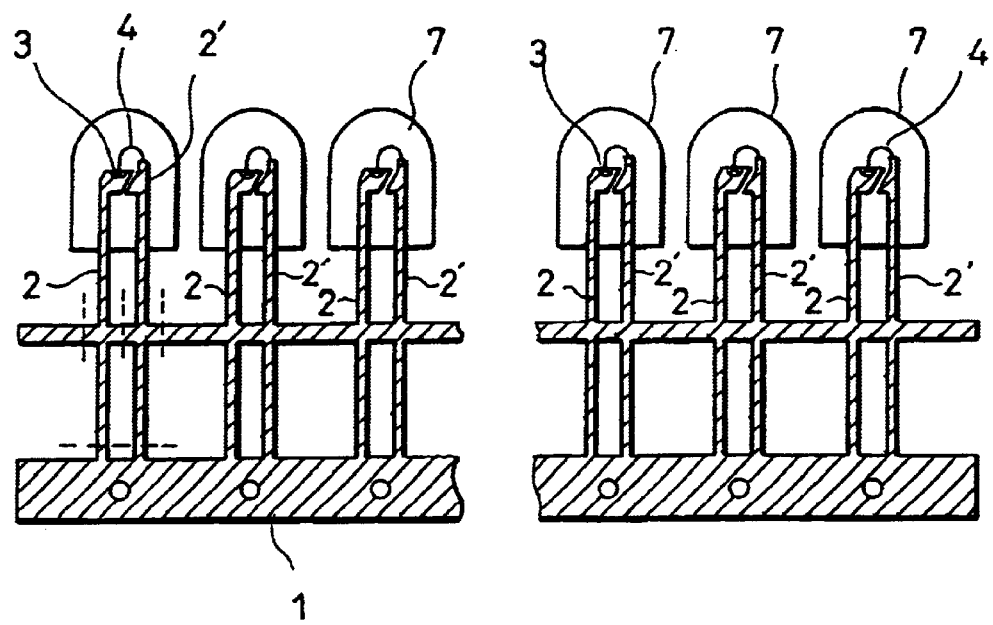

The lateral cross-section of the envelope for a semiconductor light-emitting device of the present invention has a long axis 801 and a short axis 802 and has a non-circular shape symmetrical around these axes 801 and 802, as shown in FIGS. 8A and 8B.

By positioning the short axis 802 so that it is parallel to the longitudinal direction of the lead frame 1 shown in FIGS. 8A and 8B, and by positioning the long axis 801 so that it is perpendicular to the short axis 802, it is possible to lengthen the long axis 801 without changing the spacing of the lead groups on the lead frame 1.

It is therefore possible to provide a large area as compared to a circle in which the length of the short axis 802 is the diameter, therefore the external efficiency of the light-emitting element is improved and the output of light emitted from the semiconductor light-emitting device can be increased.

Figure 12:
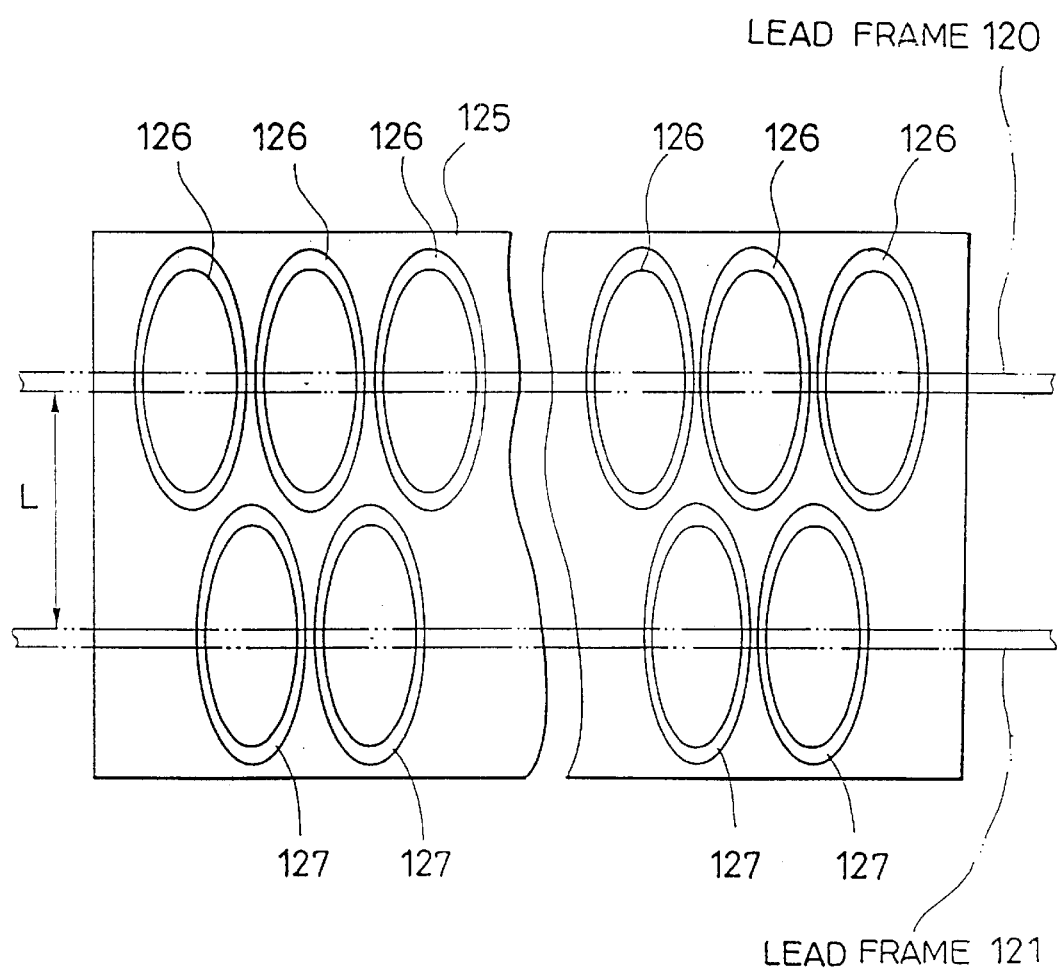
FIG. 12 is a view of the upper surface of a fourth embodiment (envelope adjusting jig) of the present invention.

In addition, as shown in FIG. 12, by arranging lead frames 120 and 121 in parallel stages and offsetting these envelopes 126 and 127 alternately in the longitudinal direction, it is possible to make the long axis longer than the spacing "L" of the lead frames 120 and 121, thus increasing the light output.

A first embodiment of the present invention will now be explained with reference to FIG. 5 to FIGS. 9A and 9B.

Figure 5:
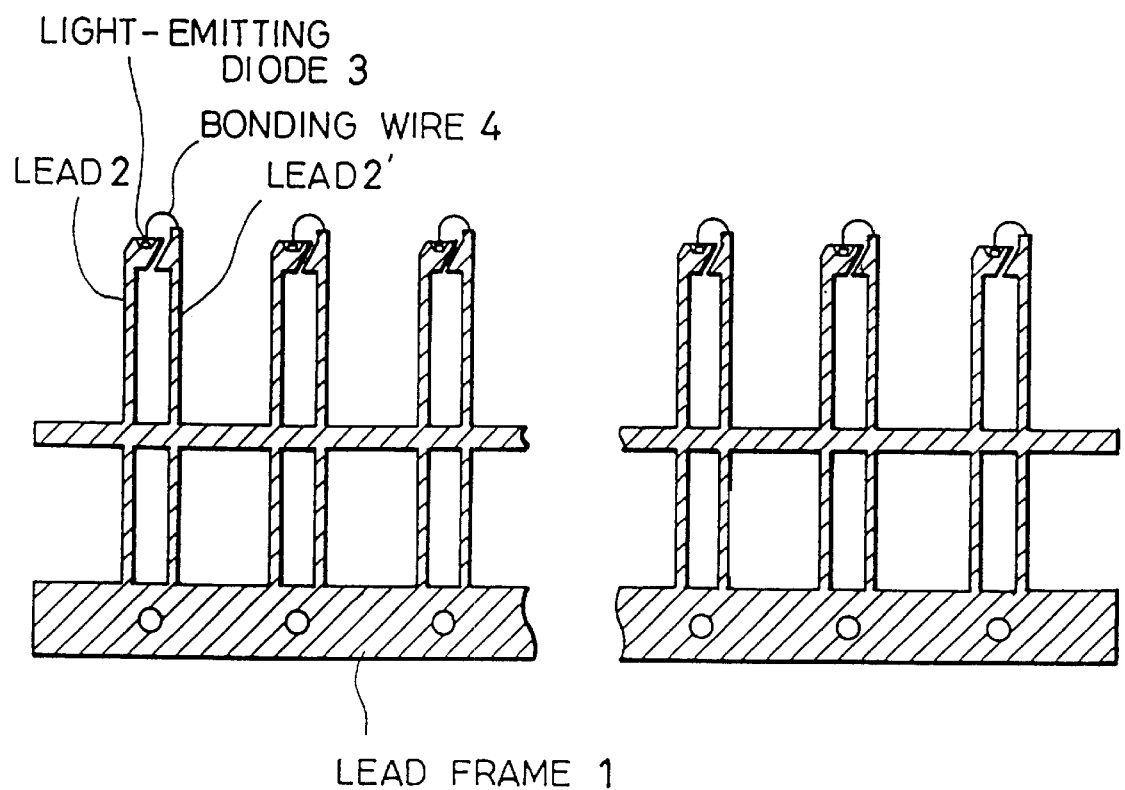
FIG. 5 is a diagram showing a semiconductor light-emitting element mounted on and bonded to a lead frame.

FIG. 5 is a diagram showing a semiconductor light-emitting element mounted on and bonded to a lead frame.

Figure 6A:
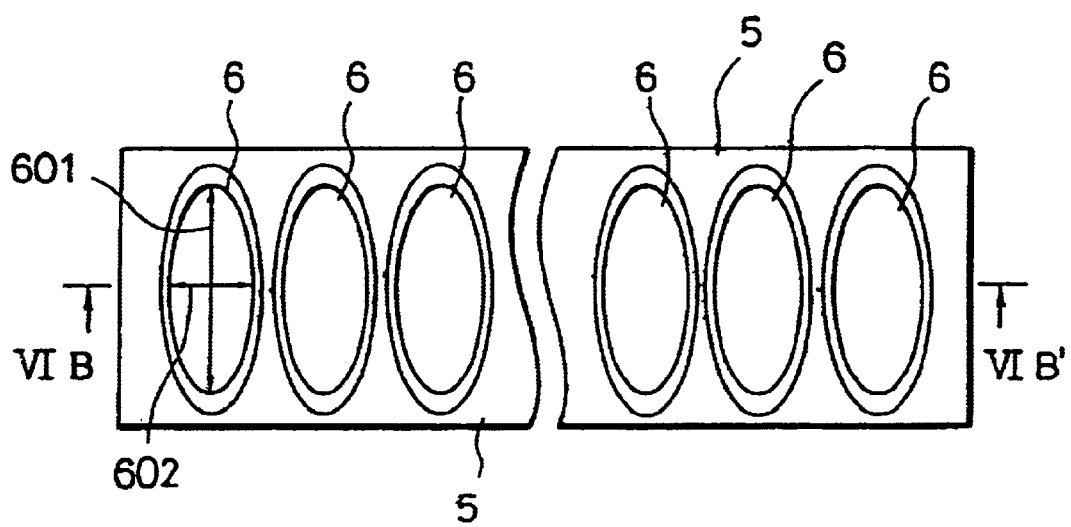
FIGS. 6A and 6B are diagrams illustrating a first embodiment of an envelope adjusting jig of the present invention, which is used to form the semiconductor light-emitting element of the present invention along the line VI B–VI B' in FIG. 6A.

FIG. 6A is a diagram showing the upper surface of a first embodiment of an envelope adjusting jig of the present invention.

Figure 6B:
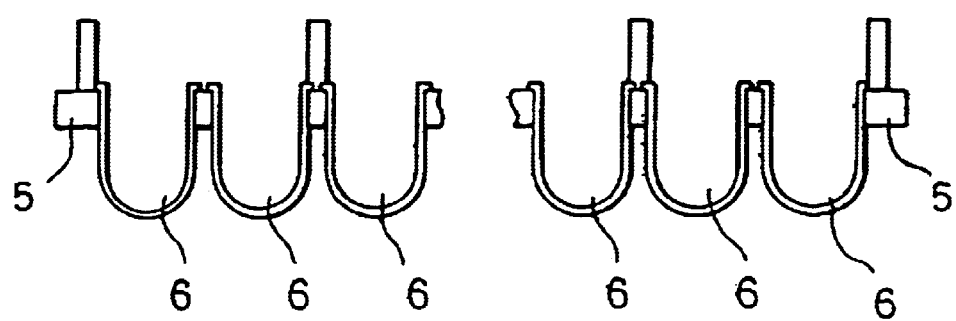

FIG. 6B is a longitudinal cross-section viewed along the line VI B–VI B' in FIG. 6A.

Figure 7:
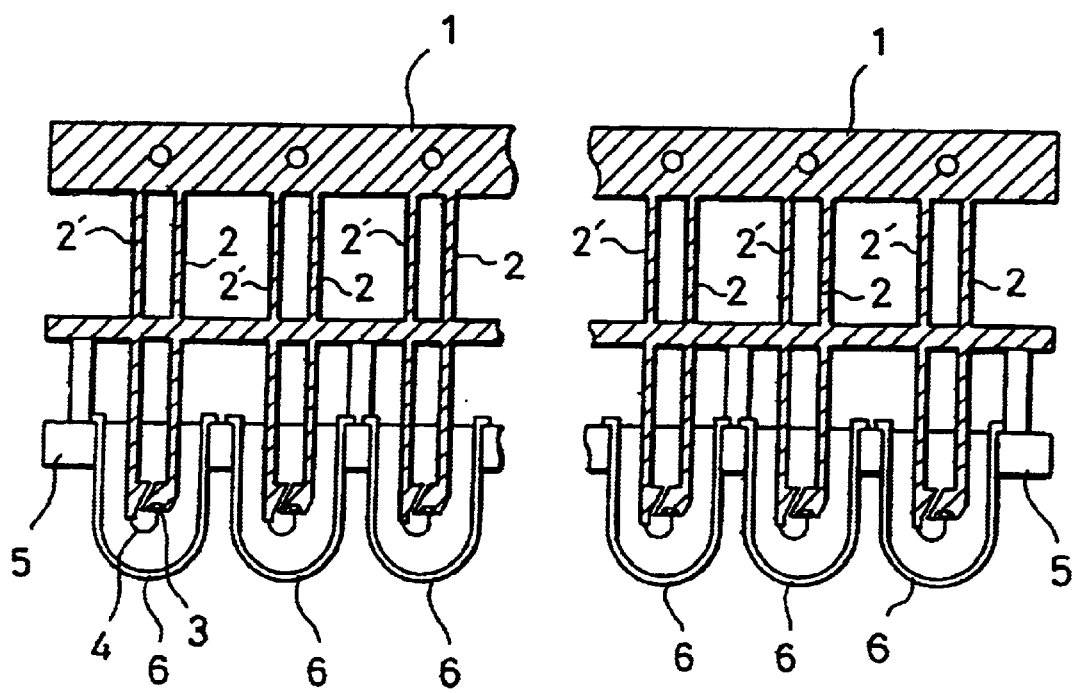
FIG. 7 is a general diagram of a process for sealing the semiconductor light-emitting element, metal wiring, and the upper section of a lead with resin.

FIG. 7 is a general diagram of a process for sealing the semiconductor light-emitting element, metal wiring, and the upper section of a lead with resin.

FIG. 8A is a view showing the upper surface after shape of the envelopes in the first embodiment of the present invention.

FIG. 8B is a longitudinal cross-section viewed along the line VII B–VII B' in FIG. 8A.

Figure 9A:
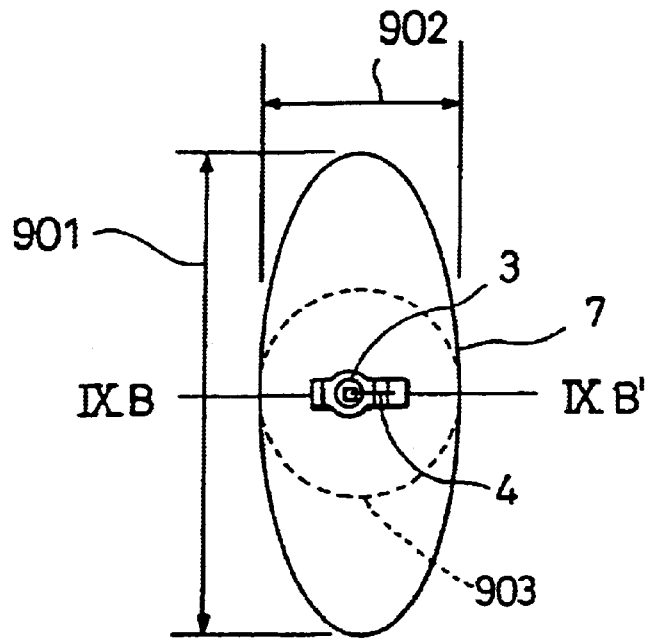
FIGS. 9A and 9B are diagrams illustrating a completed first embodiment of the semiconductor light-emitting device of the present invention.
Figure 9B:
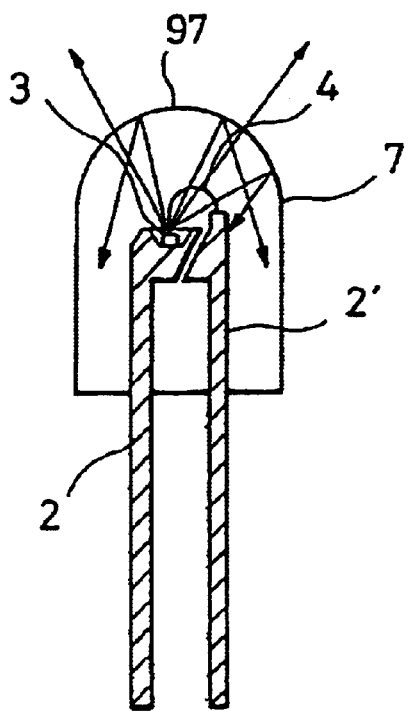

FIG. 9A is a diagram showing the upper surface of a completed first embodiment of the semiconductor light-emitting device of the present invention. FIG. 9B is a longitudinal cross-section viewed along the line IX B–IX B' in FIG. 9A.

In FIG. 5, the reference numeral 1 designates a lead frame. A plurality of lead groups, each made up of a pair of leads 2, 2', is formed at a uniform spacing in the longitudinal direction of the lead frame 1.

In FIG. 6A, the reference numeral 5 designates an envelope adjusting Jig. A plurality of cavities 6 with oblong specifically elliptical lateral cross-sections and almost U-shaped longitudinal cross-sections is positionally arranged in a straight line at the same spacing as the lead groups on the lead frame.

In each lead group 2, 2', as shown in FIG. 7, a concave section is provided in a thick section of the distal upper end of the one lead 2, and a semiconductor light-emitting element 3 is mounted, using a conductive adhesive, on the bottom of this concave section.

An adhesive temperature of 200° C. to 300° C. is used at this time. Then, the semiconductor light-emitting element 3 and the distal upper end of the other lead 2' are electrically connected by a metal wire 4.

Next, as illustrated in FIG. 7, the cavities 6 of the envelope adjusting jig 5 in FIGS. 6A and 6B are filled with a light-transmitting resin (a liquid mixture of epoxy resin and a curing agent), the lead groups are immersed in the light-transmitting resin in the cavities 6 in the envelope adjusting jig 5, and placed for two to some tens of hours in an oven maintained at 100° C. to 130° C., for curing.

As illustrated in FIG. 7, the semiconductor light-emitting element 3, the metal wire (for example, Fe wire), and the upper section of the lead group are immersed into the above-mentioned liquid mixture.

After thermal curing, the lead groups are separated from the envelope adjusting jig 5, and the lead groups are completely cut away from the lead frame 1 at the dotted line in FIG. 8B.

In the above-described first embodiment of the semiconductor light-emitting device and method for manufacturing the device, as shown in FIGS. 5 to 9A and 9B, the envelope is shaped as an ellipse.

Figure 1:
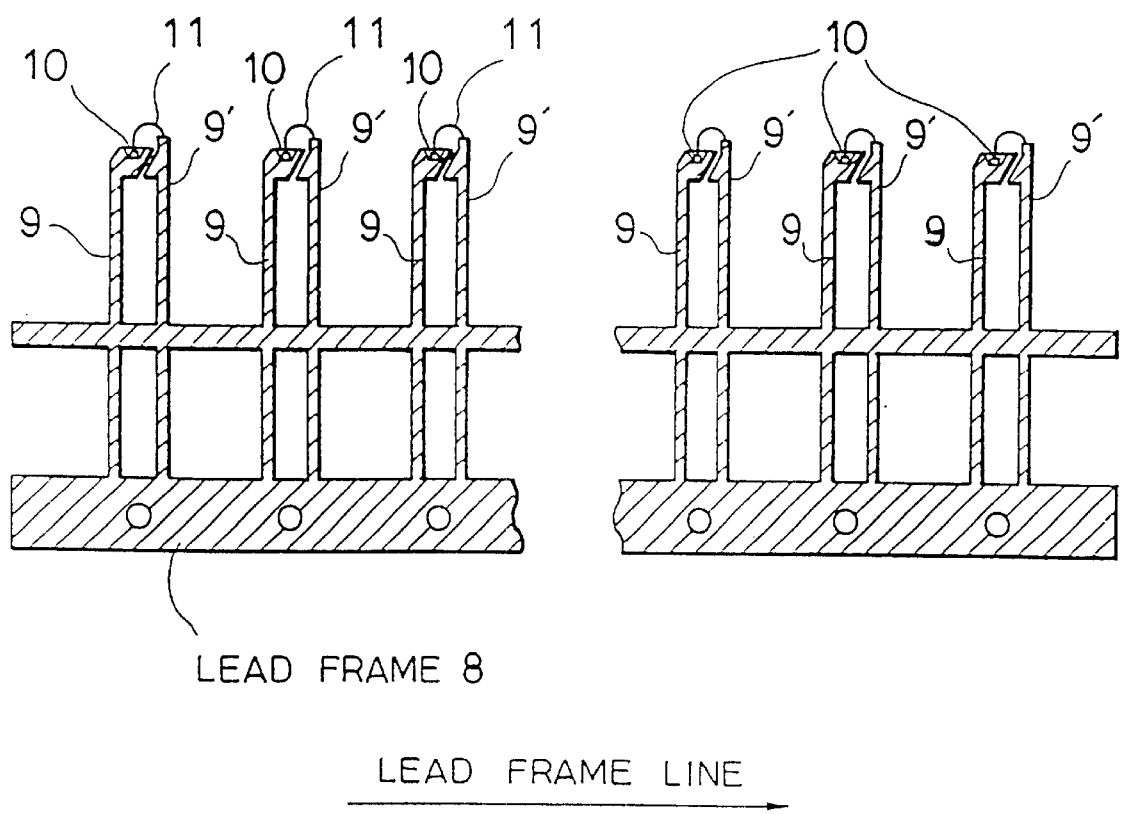
FIG. 1 is a cross sectional diagram showing a semiconductor light-emitting element mounted on and bonded to a lead frame in a conventional example.
Figure 2A:
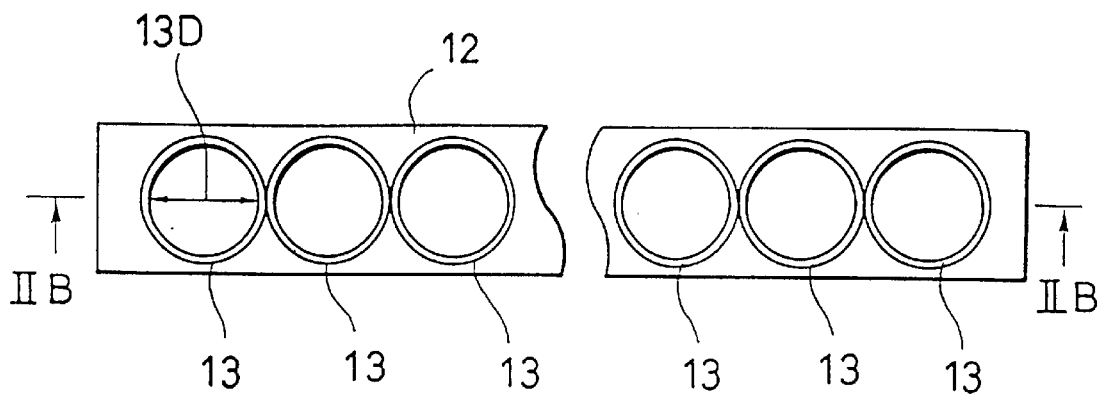
FIGS. 2A and 2B are views of a conventional envelope adjusting jig.

By making the length of the short axis 802 of the lateral cross-section of the ellipse equal to the diameter 13D of the circle of the envelope 13 shown in FIG. 2A, it is possible to produce the same number of semiconductor light-emitting devices from one lead frame as in the conventional example.

Figure 2B:
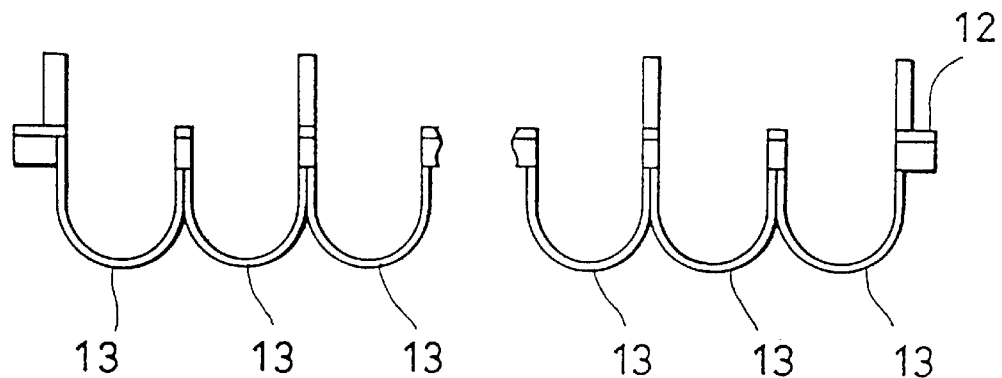
Figure 3A:
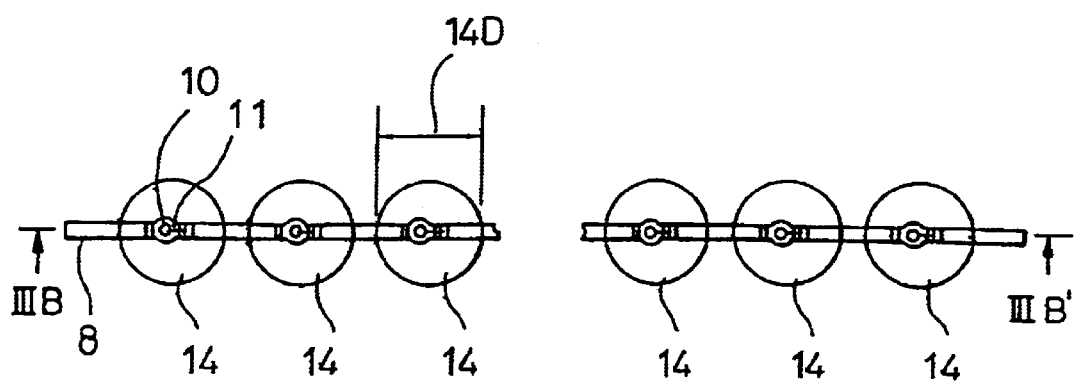
FIGS. 3A and 3B are diagrams showing the conditions after shape of the envelopes in a conventional device.
Figure 3B:
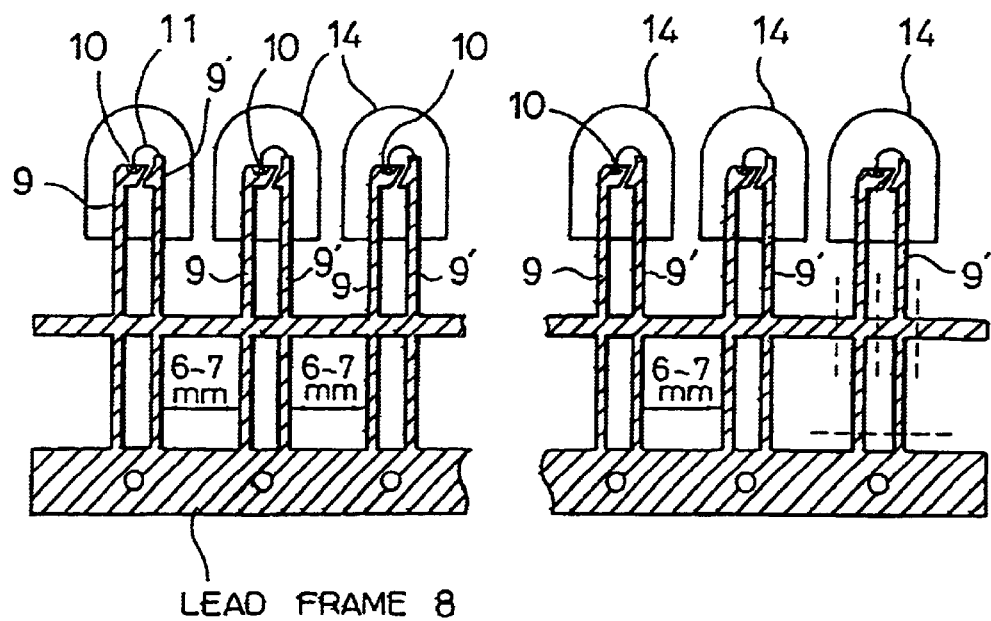
Figure 4A:
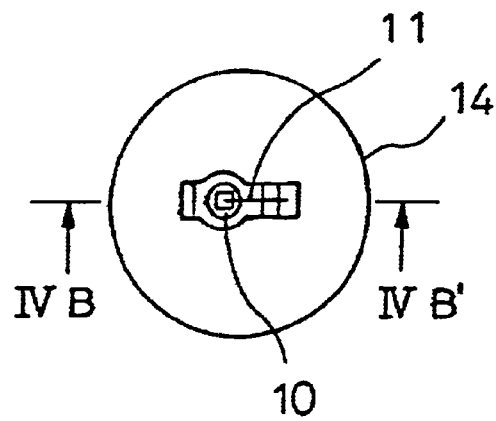
FIGS. 4A and 4B are diagrams illustrating a completed conventional semiconductor light-emitting device.
Figure 4B:
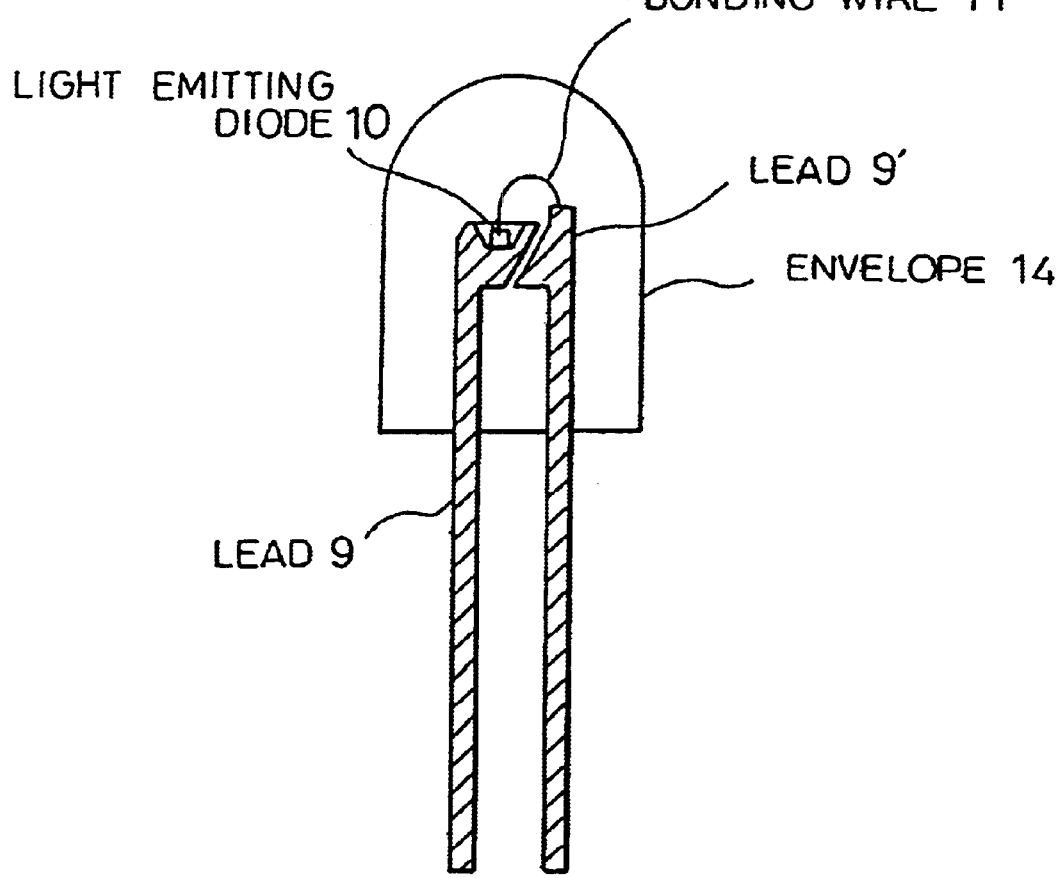

When comparing the output of light for the conventional example and for this embodiment, for the area of the lateral cross-section IX B–IX B' shown in FIGS. 9A and 9B, the length of the short axis 902 of the ellipse, which is the cross-sectional shape of the envelope 7 of this embodiment, and the length of the diameter 902 of the circle shown by the dotted line 903 in FIG. 9A, which is the cross-sectional shape of the envelope 13 of the conventional example shown in FIGS. 2A and 2B, are the same, therefore the length of the long axis 901 of the ellipse of this embodiment is larger.

When the cross-sectional area of the envelope 7 is large, it is possible to consider the semiconductor light-emitting element as a point light-emitting source of no magnitude.

For this reason, the light-emitting element 3 can be positioned at an optically ideal geometrical position, so that remarkably improved light condensing characteristics can be provided, and the ratio of the light passing through the interior of the resin which is reflected from the surface 97 of the light-transmitting resin shown in FIG. 9B is low.

Accordingly, the external light-emitting efficiency is improved, and a semiconductor light-emitting device is obtained with a higher than conventional output.

Other preferred embodiments of the present invention will now be explained with reference to the drawings.

Figure 10A:
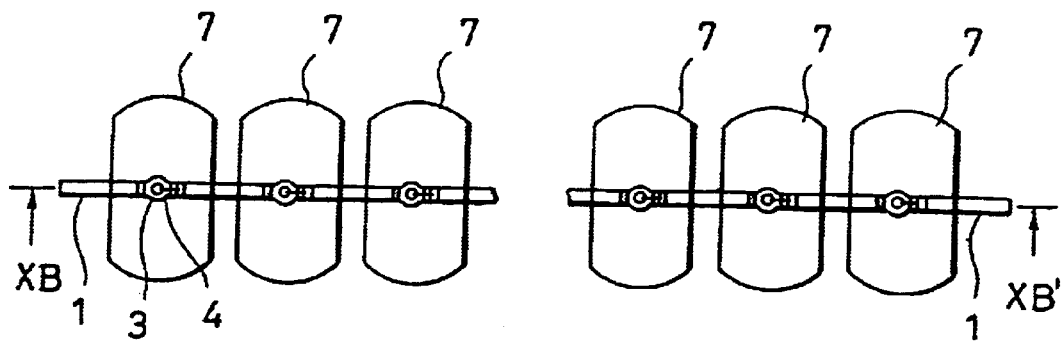
FIGS. 10A and 10B are diagrams showing the conditions after shape of the envelopes in a second embodiment of the present invention.
Figure 10B:
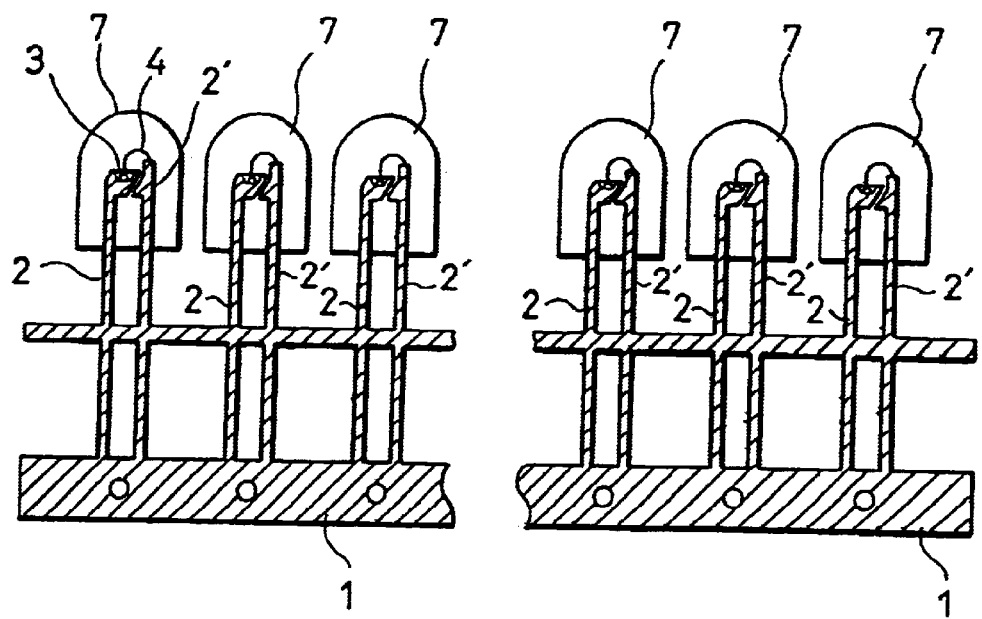

FIGS. 10A and 10B are diagrams showing a second embodiment of the present invention.

Figure 11A:
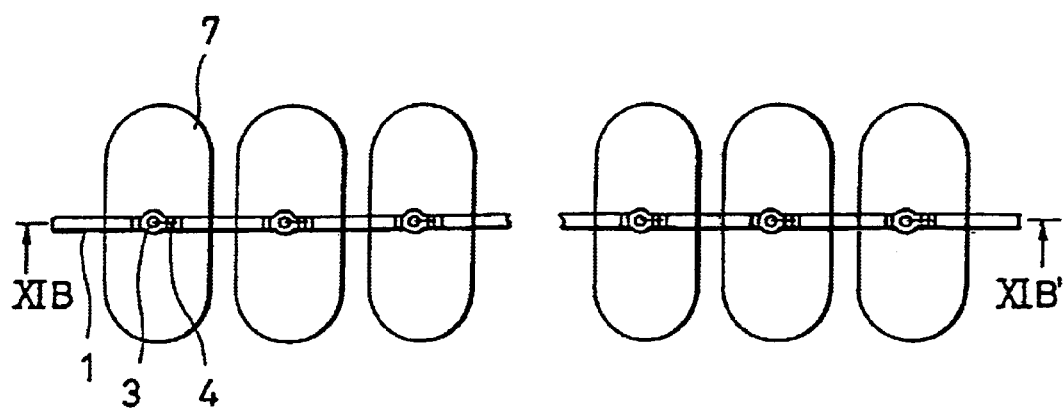
FIGS. 11A and 11B are diagrams showing the conditions after shape of the envelopes in a third embodiment of the present invention.
Figure 11B:
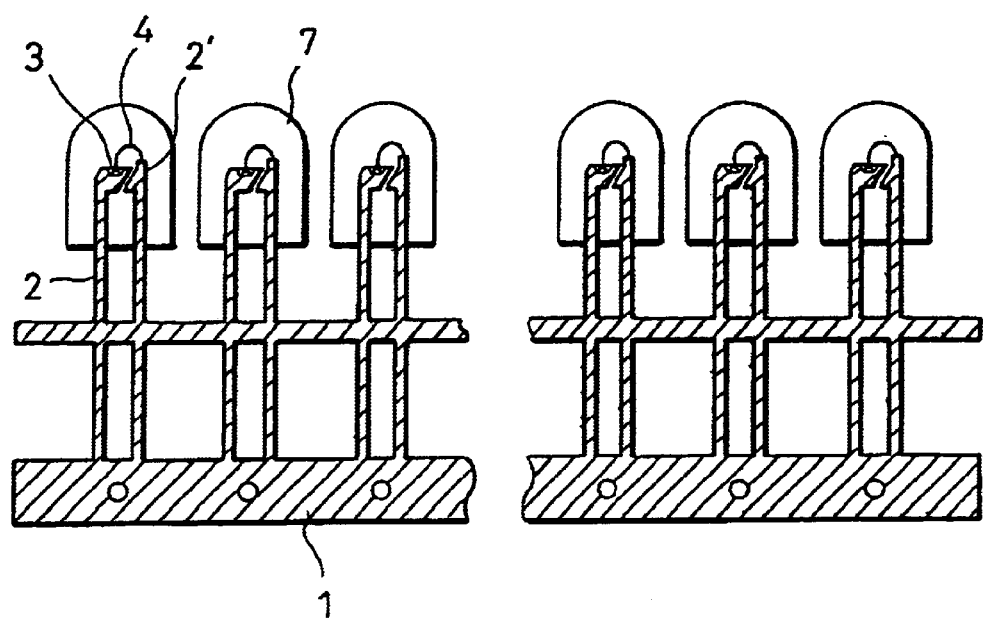

FIGS. 11A and 11B are diagrams showing a third embodiment of the present invention.

Parts which are identical or which correspond to the parts in the first embodiment have been designated by the same reference numerals as in the first embodiment so a further detailed explanation has been omitted.

Specifically, in the second embodiment shown in FIGS. 10A and 10B, the lateral cross-sectional shape of the envelope 7 is that of a circle of which part is cut off along the long axis.

Also, in the third embodiment shown in FIGS. 11A and 11B, the lateral cross-sectional shape of the envelope 7 is that of an ellipse of which part is cut off along the long axis.

The shapes of these envelopes 7 are obtained by using envelope adjusting jigs with cavities provided with the desired cross-sectional shapes.

The same effect is obtained in each of these two embodiments as in the first embodiment.

A fourth embodiment of the present invention will now be explained with reference to FIG. 12.

FIG. 12 is a view of the envelope adjusting jigs of FIGS. 6A and 6B with these jigs arranged in two rows so that the jigs in the lower row are alternately offset and positioned at the midpoint of the spacing of the jigs in the upper row in the longitudinal direction.

By this arrangement, the lateral cross-section is even longer in the long axis direction as a result of the displacement of the cavities in the longitudinal direction, and, specifically, a semiconductor light-emitting device with a higher output is obtained.

In addition, even if the cross-sectional shape is unchanged, it is possible to pack the cavity spacing in the longitudinal direction so that more lead frames can be arranged in the same amount of space. Accordingly, the production efficiency can be improved.

Figure 13A:
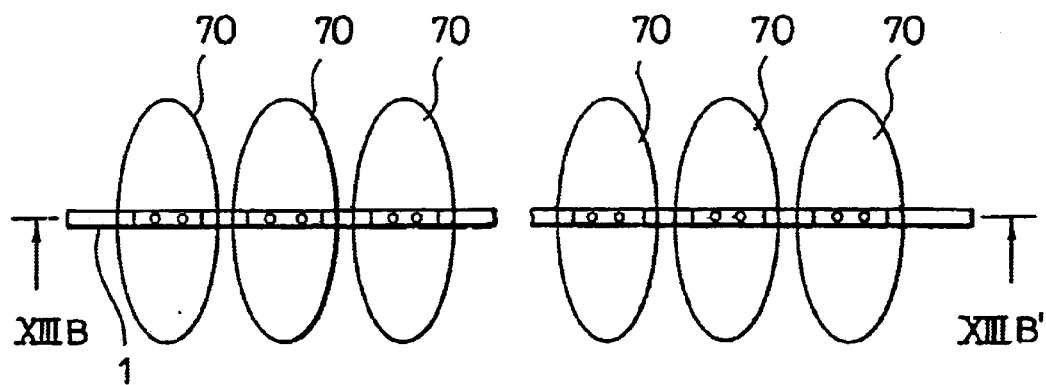
FIGS. 13A and 13B are diagrams showing the conditions after shape of the envelopes in a fourth embodiment of the present invention.

FIG. 13A is a view of the upper surface of the semiconductor light-emitting device as the fifth embodiment according to the present invention.

Figure 13B:
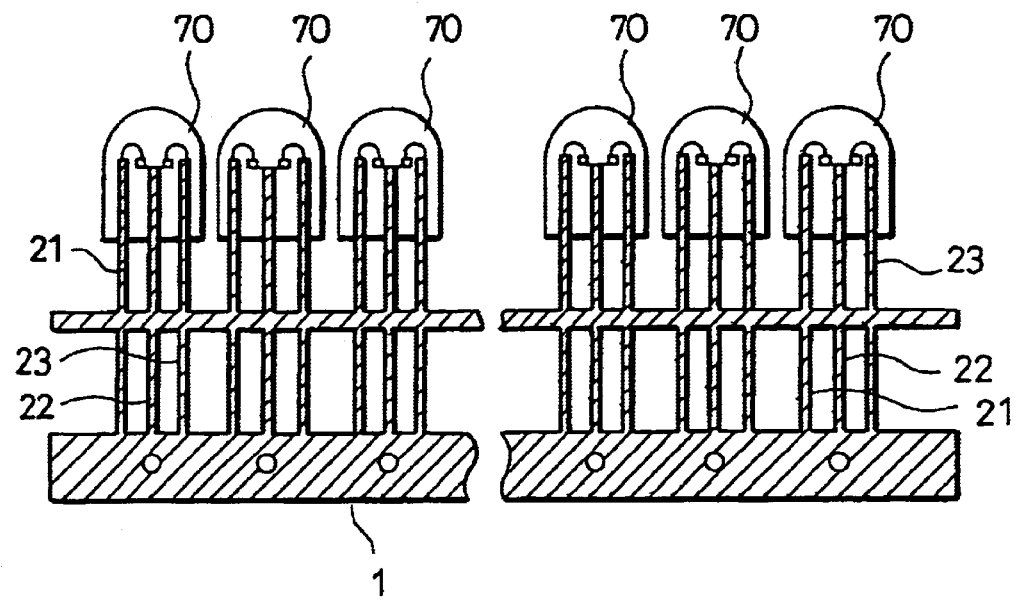

FIG. 13B is a longitudinal cross section viewed along the line X III–X III B' in FIG. 13A.

This invention is not limited to the above embodiments. The present invention can be applicable to another semiconductor light-emitting elements, for example, to a semiconductor light-emitting device having envelopes 70 and three leads 21, 22, and 23, as shown in FIGS. 13A and 13B.

Although, each light-emitting device as the fifth embodiment has a pair of semiconductor light-emitting elements, it is also possible to obtain a semiconductor light-emitting device with a higher output than that of a conventional device without changing the number of semiconductor light-emitting devices obtained from one lead frame.

By means of the present invention, it is possible to obtain a semiconductor light-emitting device with a higher output than that of a conventional device without changing the number of semiconductor light-emitting devices obtained from one lead frame.

Also, by mean of the present invention, if the output from a semiconductor light-emitting device is kept the same, it is possible to increase the number of semiconductor light-emitting devices obtained from one lead frame, therefore the production efficiency is improved. In addition the size of the Jigs can be reduced.

What is claimed is:

1. A semiconductor light-emitting device comprising:

at least two parallel leads having adjacent distal ends;

a semiconductor light-emitting chip mounted on the distal end of one of said leads;

a bonding wire for electrically connecting the semiconductor light-emitting chip and the distal end of another of the at least two leads; and a light-transmitting resin, for sealing said semiconductor light-emitting chip, said bonding wire, and the distal ends of said leads, the light-transmitting resin having a side surface defined in lateral cross section by an ellipse having a long axis and a short axis, the long axis being perpendicular to a lateral straight line as extending through said at least two parallel leads, and a convex external end surface for transmitting light from the semiconductor light-emitting chip to the exterior of the light-transmitting resin.

2. The semiconductor light-emitting device as claimed in claim 1 comprising two of said lead, and one of said semiconductor light-emitting chip.

3. The semiconductor light-emitting device as claimed in claim 1 comprising three of said leads, and two of said semiconductor light-emitting chips.

4. The semiconductor light-emitting device as claimed in claim 1 wherein each of said parallel leads has a square cross section.

* * * * *

UNITED STATES PATENT AND TRADEMARK OFFICE
CERTIFICATE OF CORRECTION

PATENT NO. : 6,677,614 B1
DATED : January 13, 2004
INVENTOR(S) : Komoto et al.

It is certified that error appears in the above-identified patent and that said Letters Patent is hereby corrected as shown below:

<u>Title page,</u>
Item [75], Inventors, change "Kitakyusyu" to -- Kitakyushyu --.

<u>Column 8,</u>
Line 28, change "lead," to -- leads, --.

Signed and Sealed this

Twentieth Day of April, 2004

JON W. DUDAS
*Acting Director of the United States Patent and Trademark Office*